United States Patent
Yu

(10) Patent No.: US 6,554,624 B1
(45) Date of Patent: Apr. 29, 2003

(54) SOCKET ASSEMBLY WITH PICK-UP CAP

(75) Inventor: Hung-Chi Yu, Hsi-Chih (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/016,091

(22) Filed: Dec. 6, 2001

(51) Int. Cl.⁷ .............................................. H01R 13/44
(52) U.S. Cl. ..................................... 439/135; 439/940
(58) Field of Search ............................... 439/41, 135 J, 439/148, 342, 509, 940, 136, 137, 476.1

(56) References Cited

U.S. PATENT DOCUMENTS

| | | | | |
|---|---|---|---|---|
| 4,726,793 A | * | 2/1988 | Bright | 439/751 |
| 5,342,214 A | * | 8/1994 | Hsu | 439/342 |
| 5,547,389 A | * | 8/1996 | Hsu | 439/342 |
| 5,651,684 A | * | 7/1997 | Northey et al. | 439/41 |
| 6,210,197 B1 | * | 4/2001 | Yu | 439/342 |
| 6,231,367 B1 | * | 5/2001 | Hsiao et al. | 439/342 |

* cited by examiner

Primary Examiner—Thanh-Tam Le
(74) Attorney, Agent, or Firm—Wei Te Chung

(57) ABSTRACT

A socket assembly (1) comprises a socket (2) and a pick-up cap (3) with a plurality of pins (31) assembled on the socket. The socket comprises a bottom base (20), a top cover (22) movably assembled on the bottom base, a plurality of terminals (21) assembled in the bottom base, and an actuating lever (23) pivotably sandwiched between the top cover and the bottom base. When the cam lever is in a closed position, the pins are engaging with the terminals to securely retain the pick-up cap on the socket for facilitating suction by a pick up device.

9 Claims, 5 Drawing Sheets

SOCKET ASSEMBLY WITH PICK-UP CAP

BACKGROUND OF THE INVENTION

1. Field of the Invention

The present invention relates to a socket assembly, and particularly to a socket assembly with a pick-up cap for facilitating suction by a pick up device.

2. Description of Related Art

Integrated circuit chip, such as a central processing unit (CPU), is a necessity for a computer. Generally, a socket is used to connect the integrated circuit chip with a motherboard. As the processing speed of the integrated circuit chip is increasingly fast, the conventional package of the socket, such as a pin grid array (PGA), cannot meet the demand of the fast running speed of the integrated circuit chip. Thus, the package of the socket has been changed into ball grid array (BGA). As is well known in the art, the PGA socket is through-hole soldered on a motherboard, and the BGA socket is welded on a motherboard through surface mounting technology (SMT). In through-hole soldering, the socket may be manually placed on the motherboard and then welded on the motherboard. Whereas, in SMT welding, a socket must be sucked by a pick up device and placed on a motherboard with terminals of the socket mating with corresponding pads of the motherboard. Subsequently, bottom ends of the terminals are soldered on the solder pad by Infrared reflow. In the SMT welding process, a pick-up cap is required to facilitate suction by the pick up device. In conventional practice, a pick-up cap is substantially a plastic plate with a few spring plastic arms for engaging with the socket. However, in high temperature during the SMT welding, the plastic arms are easy to deform permanently and lose elasticity. Thus, the conventional pick-up cap cannot endure repeated suction.

Hence, a socket assembly with a pick-up cap enduring repeated suction is required.

SUMMARY OF THE INVENTION

Accordingly, the object of the present invention is to provide a socket assembly with a pick-up cap that can endure repeated suction.

In order to achieve the object set forth a socket assembly in accordance with the present invention comprises a socket and a pick-up cap assembled to the socket. The socket comprises a bottom base, a top cover movably assembled to the bottom base, a plurality of terminals assembled into the bottom base, and an actuating lever pivotably sandwiched between the top cover and the bottom base. The bottom base comprises a plurality of receiving passageways for receiving the terminals. The top cover comprises a plurality of through holes in alignment with the receiving passageways. The pick-up cap comprises a base plate with a top planar face and a plurality of pins assembled into the base plate. In assembly, the pick-up cap is assembled to the socket with the pins being received in the through holes of the top cover and the receiving passageways of the bottom base when the actuating lever is in a free position. When the actuating lever is manually turned to a closed position, the pins of the pick-up cap are engaged with the terminals of the socket and the pick-up cap is securely retained on the socket The top planar face of the pick-up cap facilitates suction of the socket by a pick up device. In the present invention, because the pick-up cap engages with the socket with the metal pins which endure high temperature, the pick up may endure repeated suction.

Other objects, advantages and novel features of the invention will become more apparent from the following detailed description when taken in conjunction with the accompanying drawings.

DETAILED DESCRIPTION OF THE INVENTION

Figure 1:
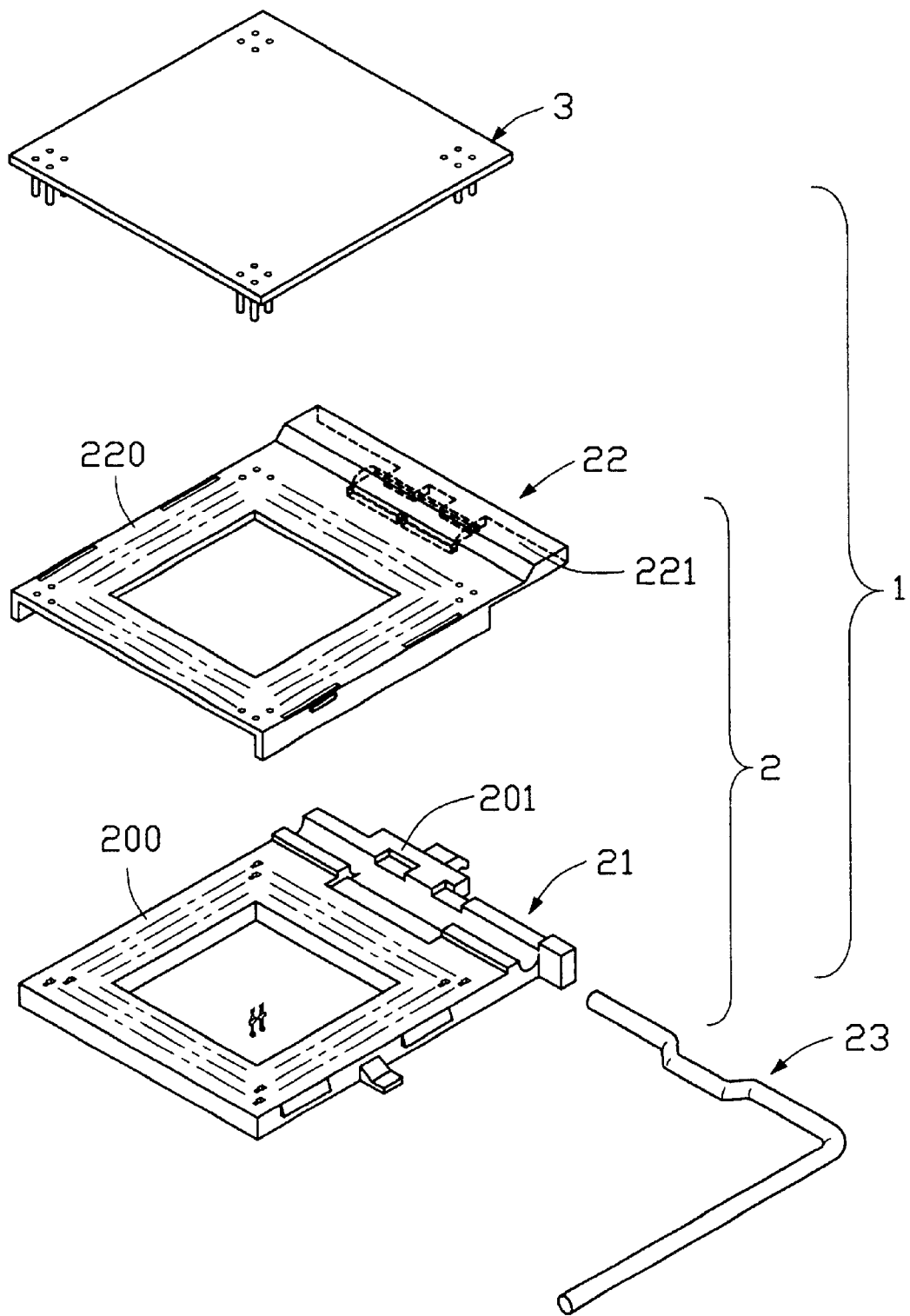
FIG. 1 is a perspective, exploded view of a socket assembly of the present invention.

Reference will now be made to the drawing figures to describe the present invention in detail.

Referring to FIG. 1, a socket assembly 1 of the present invention comprises a CPU socket 2 and a pick-up cap 3 for being mounted on the socket 2 for suction by a pick up device when soldering the socket 2 on a mating printed circuit board (PCB) (not shown).

Figure 2:
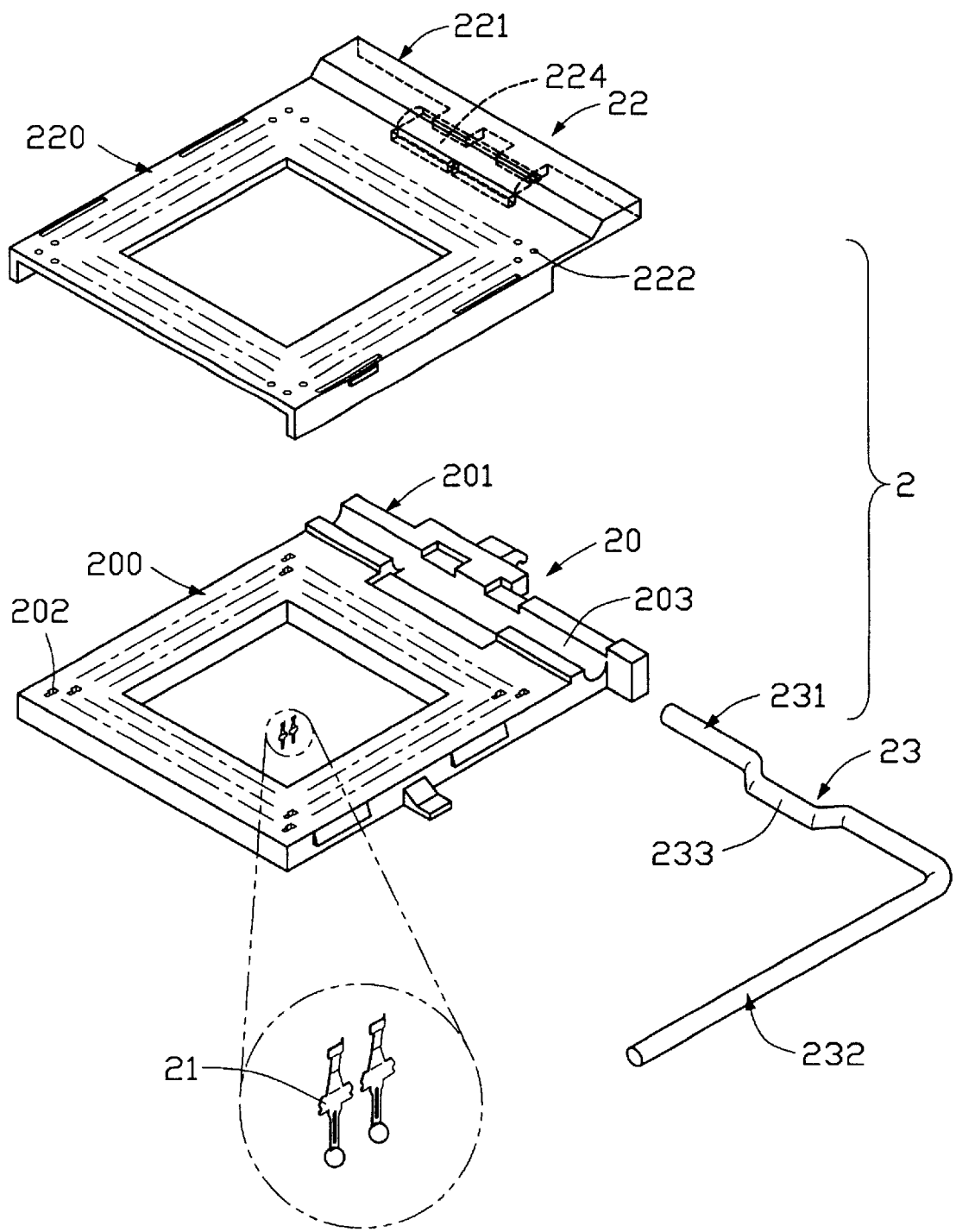
FIG. 2 is a perspective, exploded view of a socket of the socket assembly in FIG. 1.

Referring to FIG. 2, the socket 2 comprises a bottom base 20, a plurality of terminals 21 assembled in the bottom base 20, a top sliding cover 22 movably assembled on the bottom base 20, and an actuating lever 23 pivotably assembled between the bottom base 20 and the top cover 22.

The bottom base 20 comprises a lower rectangular member 200 and a lower flange 201 extending rearwardly from a rear end of the lower rectangular member 200. The lower rectangular member 200 defines a plurality of spaced receiving passageways 202 extending vertically through the bottom base 20 for receiving corresponding terminals 21. The lower flange 201 defines a lower slot 203 in an upper face thereof for receiving the actuating lever 23.

Similar to the bottom base 20, the top sliding cover 22 comprises an upper rectangular member 220 and an upper flange 221 extending rearwardly from a rear end of the upper rectangular member 220. The upper rectangular member 220 defines a plurality of through receiving holes 222 for receiving corresponding pins of an integrated circuit chip (not shown). The upper flange 221 defines an upper recess 224 in alignment with the lower recess 204.

The actuating lever 23 is substantially L-shaped and includes an actuating arm 231 and a manual handle 232 extending perpendicularly from an end of the actuating arm 231. The actuating arm 231 comprises a bent portion 233 at a middle portion thereof projecting toward the manual handle 232.

Figure 3:
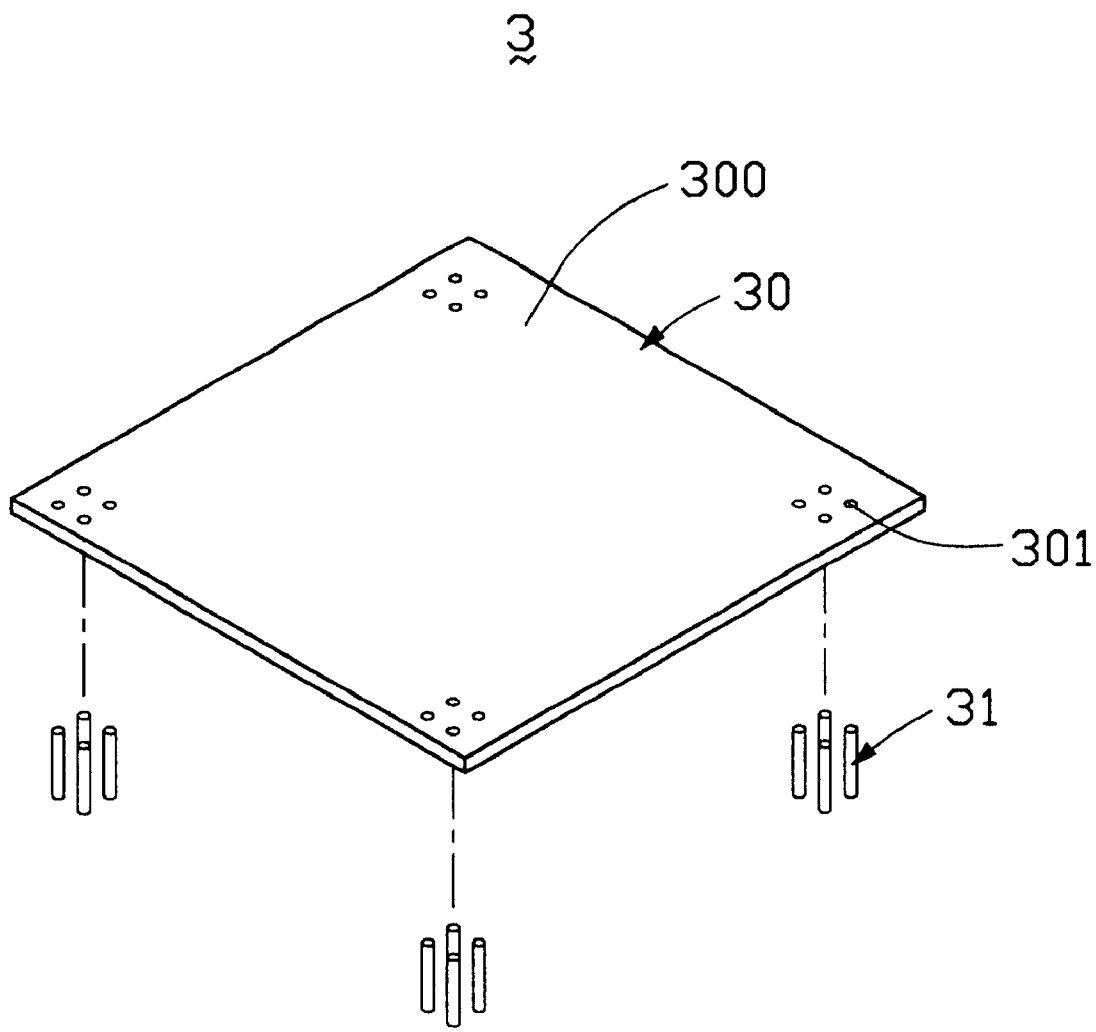
FIG. 3 is a perspective, exploded view of a pick-up cap of the socket assembly in FIG. 1.

Referring to FIG. 3, the pick-up cap 3 comprises a plastic base plate 30 and a plurality of metal pins 31 assembled to the base plate 30. The base plate 30 has a planar top face 300 and a plurality of holes 301 at four corners thereof for receiving the mental pins 31.

Figure 4:
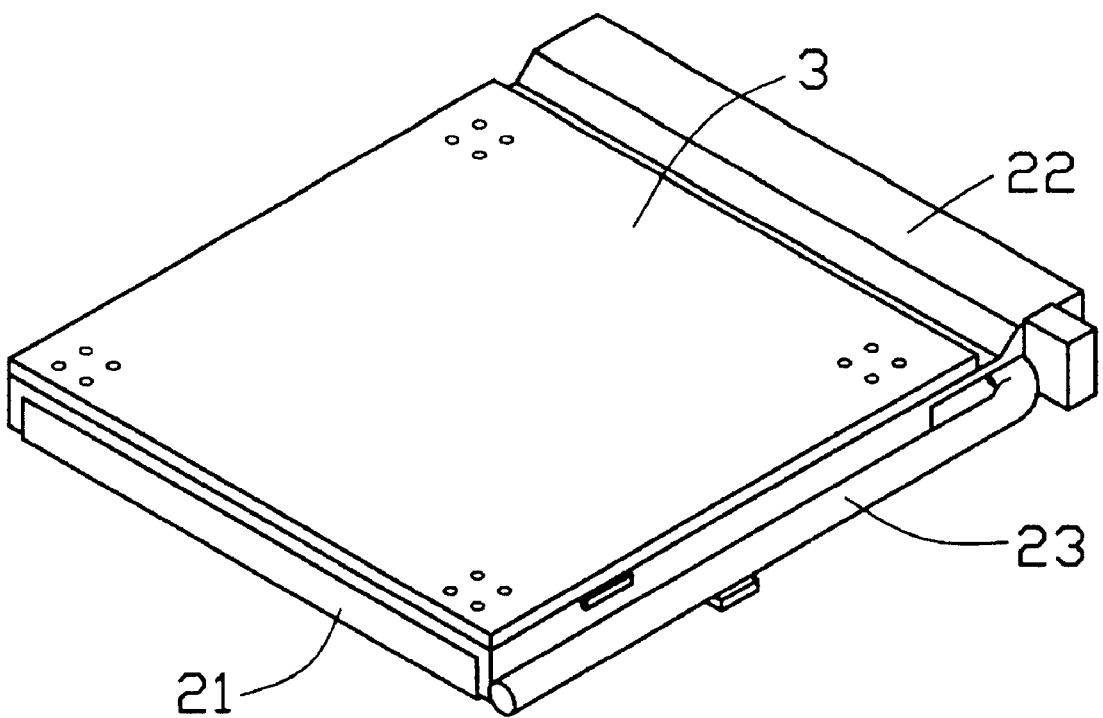
FIG. 4 is an assembled, perspective view of the socket assembly in FIG. 1.
Figure 5A:
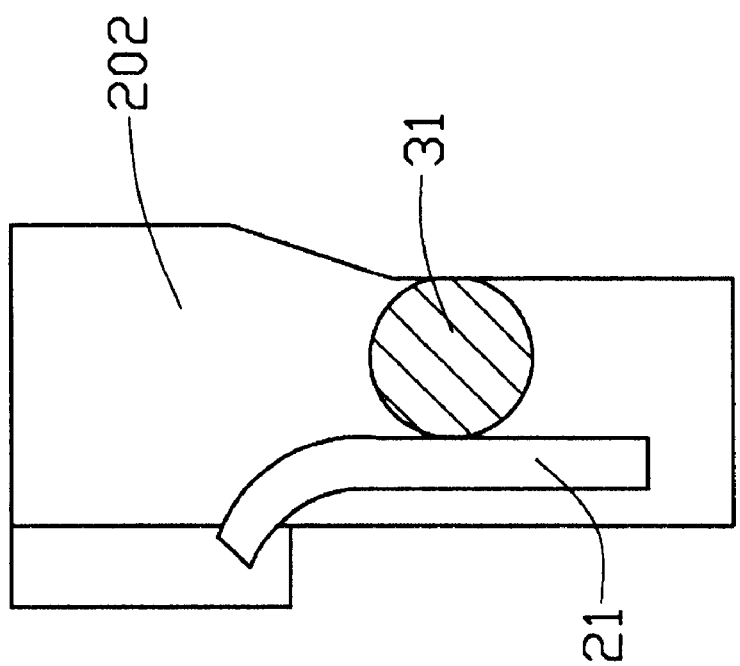
FIGS. 5A and 5B are schematic cross-sectional, views of the socket assembly illustrating the mating process between a pin of the pick-up cap and a terminal of the socket.
Figure 5B:
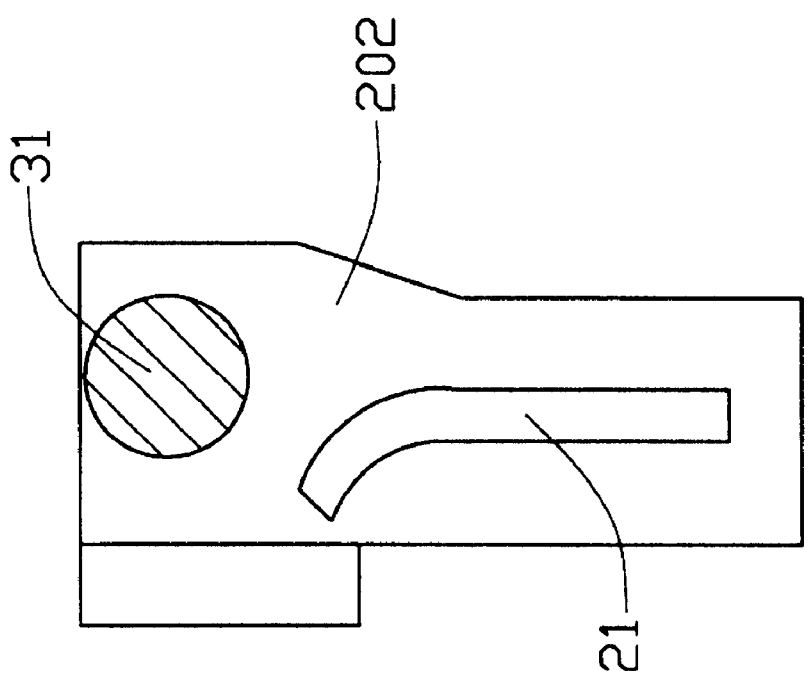

Referring to FIGS. 4 and 5A–5B, in assembly, the actuating lever 23 is placed on the bottom base 20 with the actuating arm 231 received in the lower slot 203 of the lower flange 201. Subsequently, the top cover 22 is movably assembled to the bottom base 20 with the bent portion 233 of the actuating lever 23 received in the upper recess 224. The actuating lever 23 is pivotably sandwiched between the top cover 22 and the bottom base 20. Thus, the actuating lever 23 can rotate between a free position and a closed position, i.e. a vertical position and a horizontal position, to drive the top cover 22 to move in a front-to-back direction relative to the base 20. The pick-up cap 3 is assembled to the top cover 22 with the pins 31 being received in the receiving holes 222 of the top cover 22 and the receiving passageways 202 of the bottom base 20 when the actuating lever 23 is in the flee position. Successively, the handle 232 of the actuating lever 23 is manually turned into the closed position to carry the top cover 22 together with the pins 31 of the pick-up cap 3 to move relative to the bottom base 20. The pins 31 of the pick-up cap 3 are engaged with the terminals 21 of the socket 2 and securely retained in the socket 2 by the resilient force provided by the terminals 21. Therefore, by the provision of the pick-up cap 3 having a planar top face 300, the socket assembly 1 is easy to be sucked by a vacuum pick up device for being placed on and soldered on the printed circuit board. When the actuating lever 23 is returned to the free position, the pick-up cap 3 is easily removable from the socket 2 since the pins 31 are disengaged from the terminals 21.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A socket assembly comprising:
   a socket comprising a bottom base, a top cover movably assembled to the bottom base, a plurality of terminals, and an actuator pivotably sandwiched between the top cover and bottom base for driving the top cover to move along the bottom base, the bottom base defining a plurality of receiving passageways for receiving corresponding terminals, the top cover defining a plurality of receiving holes in alignment with the receiving passageways; and
   a pick-up cap disposed over the top cover and the bottom base and comprising:
      a planar base plate sucked by a vacuum pick up device and defining a plurality of holes; and
      a plurality of pins assembled to the holes of the planar base plate; wherein
      the pins are engaged with the terminals to securely retain the planar base plate on the socket when the actuator is in a closed position and are removable from the socket when the actuator is in a free position.

2. The socket assembly as described in claim 1, wherein the planar base plate of the pick-up cap is made of plastic, and the pins of the pick-up cap are made of metal.

3. A socket assembly comprising:
   a socket including:
      a bottom base defining a plurality of receiving passageways;
      a plurality of terminals disposed in the corresponding receiving passageways; and
      a plastic pick-up cap disposed over the bottom base and defining a planar base plate sucked by a vacuum pick up device, said planar base plate defining a plurality of holes therein, a plurality of pins assembled to the corresponding holes, respectively, and downwardly extending from an undersurface of the base plate; wherein
      said pins are vertically aligned with and inserted into the corresponding passageways, respectively, and retained by the corresponding terminals; wherein
      an amount of said pins is less than that of the passageways; wherein
      a top cover is movably assembled onto the bottom base and under the pick-up cap, and defines a plurality of receiving holes in vertical alignment with the corresponding receiving passageways, respectively, said pins extending through the corresponding receiving holes; wherein
      said top cover defines free and closed positions relative to the bottom base.

4. The assembly as described in claim 3, wherein said pins are made from metal.

5. The assembly as described in claim 3, wherein the pick-up cap is inserted into or withdrawn from the socket when said top cover is in the free position.

6. The assembly as described in claim 3, wherein the pins are retainably engaged with the corresponding terminals when the top cover is in a closed position.

7. The assembly as described in claim 3, wherein said pins are located around the four corners of the planar base plate.

8. The assembly as described in claim 3, wherein the planar base plate defines a thickness similar to that of the top cover.

9. A method for assembling a socket to a PCB, the socket including a bottom base, a top cover movably assembled to the bottom base, a plurality of terminals, and an actuator for driving the top cover to move along the bottom base, the bottom base defining a plurality of receiving passageways for receiving corresponding terminals, the top cover defining a plurality of receiving holes in alignment with the receiving passageways, the method comprising the following steps:
   rotating the actuator of the socket to a flee position;
   placing a pick-up cap upon the socket with pins of the pick-up cap inserted through corresponding receiving holes of the top cover into corresponding receiving passageways of the bottom base with zero insertion force;
   rotating the actuating lever to a close position for driving the top cover and the pick-up cap to move along the bottom base of the socket and the pins of the pick-up cap to securely engage with terminals of the socket thereby forming a socket combination;
   applying a pick-up device to suck the pick-up cap and move the socket combination upon the PCB;
   soldering the terminals of the socket to the PCB;
   rotating the actuator to the free position and the terminals of the socket being disengaged with the pins of the pick-up cap; and
   removing the pick-up cap from the socket.

* * * * *